(12) United States Patent　　(10) Patent No.: US 8,971,136 B2
Jacquet et al.　　(45) Date of Patent: Mar. 3, 2015

(54) MEMORY DEVICE CORRECTING THE EFFECT OF COLLISION OF HIGH-ENERGY PARTICLES

(75) Inventors: Bruno Jacquet, Villeneuve Tolosane (FR); Raoul Rodriguez, Bruguieres (FR); Vincent Lavalette, Toulouse (FR)

(73) Assignee: Thales, Neuilly ser Seine (FR)

( * ) Notice: Subject to any disclaimer, the term of this patent is extended or adjusted under 35 U.S.C. 154(b) by 382 days.

(21) Appl. No.: 13/530,365

(22) Filed: Jun. 22, 2012

(65) Prior Publication Data

US 2013/0163307 A1　Jun. 27, 2013

(30) Foreign Application Priority Data

Jun. 23, 2011　(FR) .................................. 11 01934

(51) Int. Cl.
*G11C 7/00*　(2006.01)
*G11C 11/00*　(2006.01)
*G11C 5/00*　(2006.01)
*G11C 11/412*　(2006.01)
*H03K 3/037*　(2006.01)

(52) U.S. Cl.
CPC ............... *G11C 11/00* (2013.01); *G11C 5/005* (2013.01); *G11C 11/4125* (2013.01); *H03K 3/0375* (2013.01)
USPC ....... 365/200; 365/154; 365/201; 365/189.07

(58) Field of Classification Search
CPC ...... G11C 29/838; G11C 29/24; G11C 7/062; G11C 2013/0054
USPC .............................. 365/200, 154, 201, 189.07
See application file for complete search history.

(56) References Cited

U.S. PATENT DOCUMENTS

| | | | |
|---|---|---|---|
| 6,204,786 B1 | 3/2001 | Bieth et al. | |
| 6,211,692 B1* | 4/2001 | Shabde et al. | 324/762.01 |
| 2003/0007408 A1* | 1/2003 | Lien et al. | 365/222 |
| 2008/0244186 A1* | 10/2008 | Bose et al. | 711/135 |
| 2009/0204933 A1 | 8/2009 | Rezgui | |
| 2009/0322401 A1 | 12/2009 | Dixit | |
| 2010/0026338 A1 | 2/2010 | Fulcomer | |
| 2010/0149885 A1 | 6/2010 | Ide et al. | |
| 2011/0083041 A1* | 4/2011 | Rohleder et al. | 714/15 |

FOREIGN PATENT DOCUMENTS

EP　　0951145 A1　10/1999

* cited by examiner

*Primary Examiner* — Han Yang
(74) *Attorney, Agent, or Firm* — Baker Hostetler LLP

(57) ABSTRACT

A memory device automatically correcting the effect of collisions of high-energy particles, comprising at least one memory cell, and further comprising: retention means for retaining, for a determined period, a single copy of the stored value stored in said memory cell; detection means for detecting a change of state of said memory cell, by comparing the stored value stored in said memory cell with the value in retention in said retention means; and management means suitable for determining whether a detected change of state of said memory cell is due to a high-energy particle and, in which case, to automatically command a reloading of the stored value stored in said retention means into said memory cell.

7 Claims, 2 Drawing Sheets

MEMORY DEVICE CORRECTING THE EFFECT OF COLLISION OF HIGH-ENERGY PARTICLES

CROSS-REFERENCE TO RELATED APPLICATION

This application claims priority to foreign French patent application No. FR 1101934, filed on Jun. 23, 2011, the disclosure of which is incorporated by reference in its entirety.

FIELD OF THE INVENTION

The present invention relates to a memory device correcting the effect of collisions of high-energy particles, notably in the aerospace field.

BACKGROUND

In systems with semiconductors, the impact of a high-energy particle can cause undesirable effects.

In particular, for cells or memory points, the impact of a high-energy particle may cause it to change state or stored value. For example, a stored bit with a value 1 may change to a value 0, and vice versa.

Hardening of electronic components against ionizing rays and high-energy particles is called a method of design, of production and of testing of electronic systems and components in order to make them resistant to the malfunctions and degradations caused by electromagnetic rays and energetic subatomic particles encountered during space or high-altitude flights, and in the environment of nuclear reactors, and even during military operations.

A singular effect may be caused when a single particle passes, usually a heavy ion or an energetic proton, and may cause transitory effects (software errors or SEU for "Single Event Upset") and/or permanent effects (hardware errors or SEL for "Single Event Latchup").

An SEU is typically materialized by the changing of logic state of a memory cell under the effect of a charged particle. It is a transitory effect that will be erased by the rewriting of the affected memory cell. Any electronic circuit that has memory cells is susceptible to experiencing SEUs.

Systems are known that use a Triple Modular Redundancy or TMR. Such systems essentially consist in tripling a memory cell or memory point and in including as an output of these three redundancy memory cells a voting element for fixing as an output the majority value amongst the three memory cells.

Thus, at the time of the impact of a high-energy particle causing an SEU and a change of state or of value of a memory cell, by using a voting element with a sufficiently high clock rate for the probability of two simultaneous SEUs out of at least two of the three redundancy memory cells is virtually zero, the impact is corrected by such a system.

The production of such systems is very costly.

Moreover, this type of system is difficult to implement when it is desired to perform RF (for radiofrequency) functions because of the spectral pollution generated by the clock for rating the refresh of the data or, for other applications, when the complexity of the triple modular redundancy or TMR with a voting system is not acceptable.

SUMMARY OF THE INVENTION

One object of the invention is to alleviate the problems mentioned above.

According to one aspect of the invention, a memory device is proposed that automatically corrects the effect of collisions of high-energy particles, said device comprising at least one memory cell. The device also comprises:
- retention means for retaining, for a period, the stored value stored in said memory cell;
- detection means for detecting a change of state of said memory cell, by comparing the stored value stored in said retention means; and
- management means suitable for determining whether a detected change of state of said memory cell is due to a high-energy particle and, in which case, to automatically command a reloading of the stored value stored in said retention means into said memory cell.

Such a memory device makes it possible, at reduced cost and with no clock for rating the refresh of the data that may disrupt RF functions, to produce a memory device that is resistant to collisions of high-energy particles.

Therefore, an autorefresh of the stored item of data that has sustained a collision of a high-energy particle is possible.

Such a device is easy to produce both by means of an ASIC or by means of discrete components, unlike the triple modular redundancy or TMR that is more costly and bulky in discrete components.

In one embodiment, said memory cell comprises a D flip-flop.

The use of a D flip-flop is the type of memory cell most widely used and of low cost.

According to one embodiment, said retention means comprise an electronic circuit comprising an electrical resistor and a capacitor.

A circuit of the RC type for retaining the stored value in the memory cell is insensitive to collisions of high-energy particles. Such a circuit is also easy to produce and of low cost.

For example, said retention means also comprise a Schmitt trigger.

The use of a Schmitt trigger makes it possible to transmit as an output of the system a signal with no ripples by eliminating the internal voltage variations generated on the RC circuit due to the collisions of high-energy particles. It also makes it possible, depending on the values of R and C, to correctly program the retention time.

According to one embodiment, said detection means comprise means for performing an "exclusive OR" function.

The use of an "exclusive OR" function makes it possible simply to compare the value of the item of data as output of the memory cell and of the value in the retention means.

In one embodiment, said management means comprise two multiplexers.

One implementation of management means using two multiplexers is a simple way at reduced cost to make the difference between an instructed change of the value of the memory and an undesirable change of the value of the memory due to a collision of a high-energy particle.

For example, a stored value is a boolean value, such as a data bit, the value of which is defined as being able to be 0 or 1.

According to another aspect of the invention, an aerospace system is also proposed comprising at least one memory device as claimed in one of the preceding claims.

Such a system, for example onboard a satellite, is particularly robust to the impacts of high-energy particles.

Also proposed, according to another aspect of the invention, is a method for automatic correction of the effect of collisions of high-energy particles on a storage device, said method comprising the steps consisting in:
storing an item of data, holding in retention, for a period, a single copy of the stored value, detecting a change of value of said stored value, by comparing the stored value and the retention value, and determining whether a detected change of value of said stored value is due to a high-energy particle and, in which case automatically commanding a reloading of said value by the value in retention.

BRIEF DESCRIPTION OF THE DRAWINGS

The invention will be better understood on studying a few embodiments described as non-limiting examples and illustrated by the appended drawings in which.

In all of the figures, the elements that have the same references are similar.

DETAILED DESCRIPTION

Figure 1:
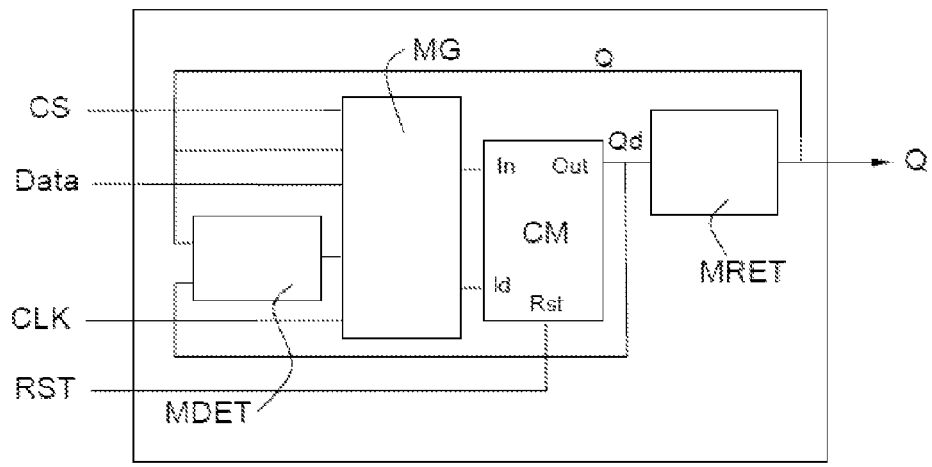
FIG. 1 illustrates schematically an example of a memory device that is resistant to the collisions of high-energy particles according to one aspect of the invention.

FIG. 1 represents a memory device that is resistant to collisions of high-energy particles, comprising at least one memory cell CM.

The device also comprises a retention module MRET, for retaining, for a determined period, the stored value in the memory cell CM.

The system also comprises a detection module MDET for detecting a change of state of the memory cell CM, by comparison with the stored value in the retention module MRET, and a management module MG suitable for determining whether a detected change of state of the memory cell CM is due to a high-energy particle and, in which case, for commanding a reloading of the value stored in the retention module MRET into the memory cell CM.

The signals involved are as follows.

The signal Qd represents the value or the state stored in the memory cell or memory point CM. The signal Qd is transmitted to the retention module MRET and as an input of the detection module MDET for detecting a change of state of the memory cell CM.

The signal Q represents the value stored as an output of the memory device, for a determined period, in the retention module MRET. The signal Q is transmitted as an output of the memory device, as an input of the detection module MDET and as an input of the management module MG.

The management module MG receives as an input, the output of the detection module MDET, the signal Q representing the value retained in the retention module MRET for the determined period. The management module MG also receives as an input the value Data or state of the item of data to be stored in the memory cell MC, and a signal CS for validation of the loading of the data accompanying the Data signal, in order to confirm a change of a normal or predicted state of the value to be stored in the memory cell CM.

The memory cell CM therefore receives, as an input, the value to be stored, the output of the management module MG, a signal for commanding the reloading of the value stored in the retention module MRET into the memory cell CM when the management module MG has determined that a change of state of the memory cell CM detected by the detection module MDET is due to a high-energy particle, and a reinitialization or reset signal RST.

Figure 2:
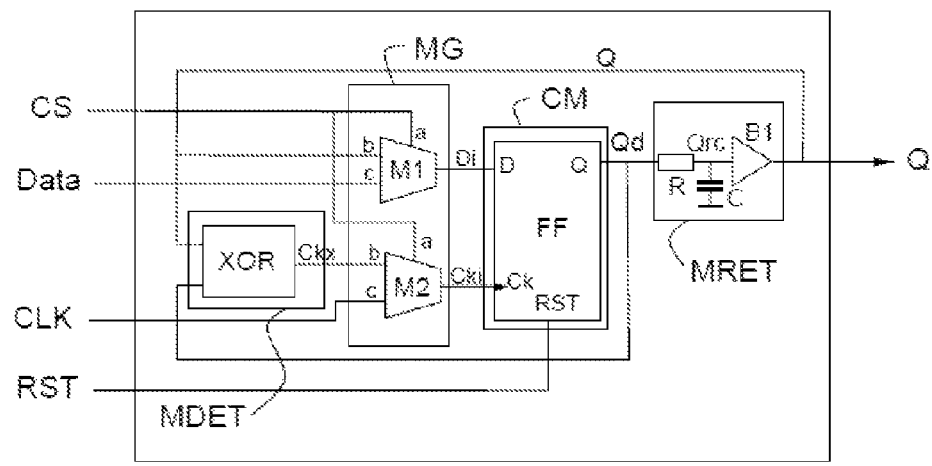
FIG. 2 illustrates schematically an exemplary embodiment of a device of FIG. 1, according to one aspect of the invention.
Figures 3A, 3B:
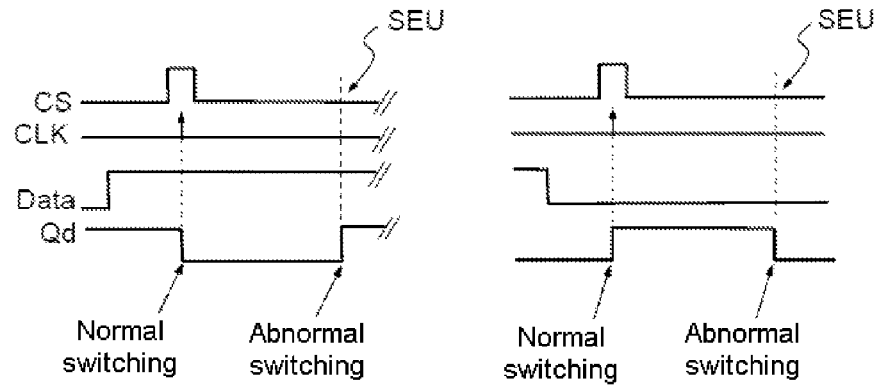
FIGS. 3a, 3b and 4 illustrate the operation of the device of FIG. 2 according to one aspect of the invention.

FIG. 2 represents one embodiment of a device of FIG. 1.

The memory cell CM may be a D flip-flop FF. A D flip-flop is a logic circuit furnished with one or two outputs and one or more inputs. The output may be at logic level 0 or 1. The changes of state of the output are determined by the signals applied to the inputs and the type of operator. What differentiates flip flops from the combinatory logic circuits (AND, OR, exclusive OR, etc. gates) is thas an output maintains its state even after the disappearance of the command signal. Since the previous state and storage are involved, this is called sequential logic. The flip-flop is the basic element of sequential logic.

As a variant, the memory cell may comprise a "latch".

The retention module MRET may be made in the form of an RC circuit comprising an electrical resistor R and a capacitor C. Thus, by correctly programming the values of the electrical resistor R and of the capacitor C it is possible to determine precisely the retention time of the value in retention.

Optionally, the retention module MRET may also comprise a Schmitt flip-flop B1 also called a Schmitt trigger or threshold comparator.

A Schmitt trigger is a cell that has an input V, two thresholds Vil and Vih and one output Q. The thresholds Vil and Vih of a Schmitt trigger have the advantage of being perfectly characterized.

The thresholds Vil and Vih (respectively the low threshold and the high threshold, the latter, Vih, being at a higher potential than Vil) are kept at fixed potentials, for example by virtue of a voltage divider consisting of three resistors placed in series between Vcc and earth. The inputs Vih and Vil are connected to the intermediate points of the divider. Operation is as follows:

assume that, at the beginning, V is at 0; Q is then at 0;

when V increases, Q remains at 0 until V exceeds Vih; at this moment, Q switches to 1;

Q remains at 1 until the moment at which V becomes less than Vil; at this moment, Q switches to 0;

Q remains at 0 until V exceeds Vih again.

The detection module MDET may comprise a module XOR for performing an "exclusive OR" function which is often called XOR, the acronym for "eXclusive OR" of output Ckx.

As a variant, the detection module MDET may comprise a module comprising logic comparators.

The management module MG may comprise two multiplexers M1 and M2 as shown in FIG. 2. Each multiplexer receives as an input a command signal a, and two inputs b and c. The value of the command signal a makes it possible to select the input b or c that is delivered as an output Di of the multiplexer M1 or as an output Cki of the multiplexer M2.

For the multiplexer M1, and for the multiplexer M2, the input command signal is the same, i.e. the signal CS.

The other two inputs of the multiplexer M1 are the signals Q and Data, while the other two inputs of the multiplexer M2 are the signal CLK and the output signal Ckx of the determination module MDET.

As a variant, the management module MG may comprise any logic means fulfilling the same function.

Figure 4:
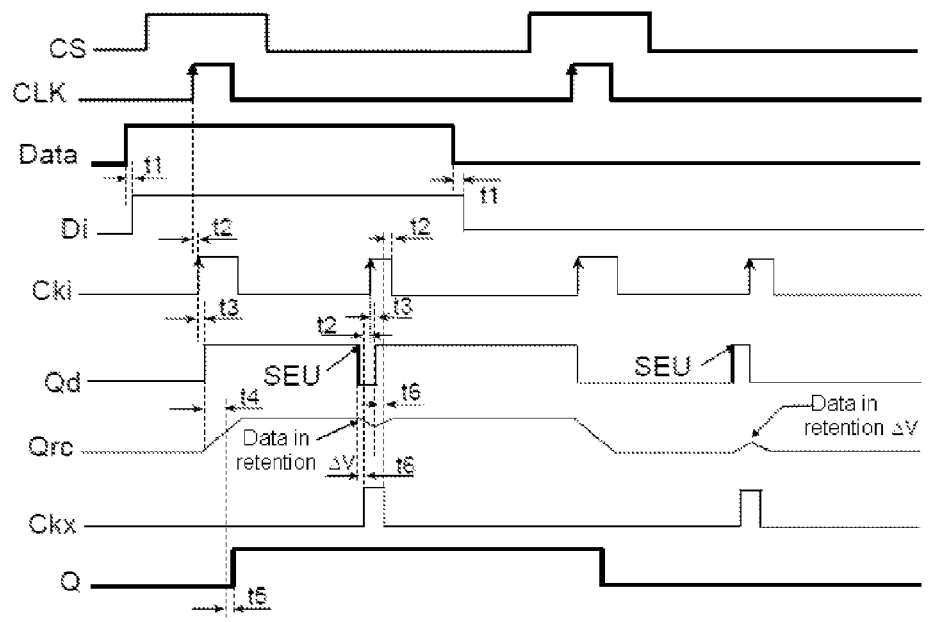

FIG. 4 illustrates schematically, via a timing diagram, the operation of the device of FIG. 2.

In a normal operating mode, while the signal CS is active (i.e. with a logic level equal to 1), the signals CLK and Data are selected and applied to the inputs Di and Cki of the flip-flop FF through the two multiplexers M1 and M2.

The signal Ckx of the module XOR is then "disconnected" so that any transitory pulse that may be generated on the output Ckx of the module XOR during the period dt of switching of the flip-flop FF is blocked by the multiplexer M2. The signal Data is transferred as an output Q through the circuit RC and the output buffer or Schmitt flip-flop B1 on the rising edge of the clock pulse CLK.

In an abnormal operating mode, for reloading following an impact of a high-energy particle or SEU, while the signal CS is inactive (i.e. with a logic level equal to 0), the signals Q and Ckx are selected and applied to the inputs Di and Cki of the D flip-flop FF through the two multiplexers M1 and M2.

Following an impact of a high-energy particle SEU, the output Qd of the D flip-flop FF changes state while the value of the item of data initially loaded is kept in retention in the circuit RC, i.e. Q has not changed state.

The module XOR then generates a pulse Ckx which reloads on the rising edge the value of the retained item of data into the flip-flop FF. The retention time of the circuit RC must be calculated in order to maintain, during the reloading sequence, the variation of electrical voltage of the signal Qrc in the range Vih or Vil of the circuit (depending on the technology used).

In order to comply with the time constraints, the correction system must satisfy the following timing formula:

$$t4min+t5min+t1min>t2max+t6max-tholdmax(FF)$$

In FIG. 4, the moments described are as follows:
- t1 represents the propagation time between the input (signal DATA or Q) and the output (signal Di) of the multiplexer M1;
- t2 represents the propagation time between an input (signal Ckx or CLK) and the output (signal Cki) of the multiplexer M2;
- t3 represents the propagation time between the input (signal Cki) and the output (signal Qd) of the flip-flop FF;
- t4 represents the time of rise or of descent in electrical voltage of the circuit RC (within the range Vih or Vil of the Schmitt trigger);
- t5 represents the propagation time between the input (signal Qrc) and the output (signal Q) of the Schmitt trigger B1;
- t6 represents the propagation time between an input (signal Qd or Q) and the output (signal Ckx) of the module XOR; and
- tholdmax(FF) represents the maximum hold time between the input (signal Di) and the active edge of the clock (signal Cki) of the flip-flop FF.

It should also be noted that, with this system, the reset signal RST must last longer than the retention time in order to be taken into account.

The invention claimed is:

1. A memory device automatically correcting the effect of collisions of high-energy particles, comprising at least one memory cell comprising:
   - retention means for retaining, for a determined period, a single copy of a stored value stored in said memory cell, the retention means comprising a Schmitt trigger and an electronic circuit comprising an electrical resistor and a capacitor;
   - detection means for detecting a change of state of said memory cell, by comparing the stored value stored in said memory cell with the value in retention in said retention means; and
   - management means suitable for determining whether a detected change of state of said memory cell is due to a high-energy particle and, in which case, to automatically command a reloading of the stored value stored in said retention means into said memory cell.

2. The device as claimed in claim 1, in which said memory cell comprises a D flip-flop.

3. The device as claimed in claim 1, wherein said detection means comprise means for performing an "exclusive OR" function.

4. The device as claimed in one of claim 1, wherein said management means comprise two multiplexers.

5. The device as claimed in claim 1, wherein a stored value is a boolean value.

6. An aerospace system, further comprising at least one memory device as claimed in claim 1.

7. A method for automatic correction of the effect of collisions of high-energy particles on a storage device, comprising:
   - storing an item of data,
   - holding in retention using a Schmitt trigger and an electronic circuit comprising an electrical resistor and a capacitor, for a period, a single copy of the stored value,
   - detecting a change of value of said stored value, by comparing the stored value and the retention value, and
   - determining whether a detected change of value of said stored value is due to a high-energy particle and, in which case automatically commanding a reloading of said value by the value in retention.

* * * * *